United States Patent
Benwadih et al.

(10) Patent No.: US 8,889,473 B2
(45) Date of Patent: Nov. 18, 2014

(54) METHOD FOR MANUFACTURING TWO ADJACENT AREAS MADE OF DIFFERENT MATERIALS

(75) Inventors: Mohamed Benwadih, Champigny-sur-Marne (FR); Christophe Serbutoviez, Voiron (FR); Jean-Marie Verilhac, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 41 days.

(21) Appl. No.: 13/639,284
(22) PCT Filed: Mar. 7, 2011
(86) PCT No.: PCT/FR2011/050466
§ 371 (c)(1), (2), (4) Date: Oct. 4, 2012
(87) PCT Pub. No.: WO2011/124792
PCT Pub. Date: Oct. 13, 2011

(65) Prior Publication Data
US 2013/0029455 A1    Jan. 31, 2013

(30) Foreign Application Priority Data
Apr. 8, 2010  (FR) ..................................... 10 52647

(51) Int. Cl.
*H01L 51/40*    (2006.01)
*B82Y 30/00*    (2011.01)
*H01L 51/05*    (2006.01)
*H01L 51/00*    (2006.01)
*H01L 51/10*    (2006.01)

(52) U.S. Cl.
CPC ......... *H01L 51/0007* (2013.01); *H01L 51/0545* (2013.01); *H01L 51/0055* (2013.01); *H01L 51/0525* (2013.01); *H01L 51/0005* (2013.01); *H01L 51/0074* (2013.01); *H01L 51/0022* (2013.01); *H01L 51/0053* (2013.01); *H01L 51/105* (2013.01); *H01L 51/0068* (2013.01); *H01L 51/0094* (2013.01); *B82Y 30/00* (2013.01); *H01L 51/052* (2013.01); *H01L 51/0541* (2013.01)
USPC ....... 438/99; 438/149; 438/199; 257/E21.632

(58) Field of Classification Search
USPC .................... 438/99, 149, 199; 257/E21.632, 257/E27.108
See application file for complete search history.

(56) References Cited

U.S. PATENT DOCUMENTS

2003/0059987 A1    3/2003    Sirringhaus et al.
2008/0054257 A1    3/2008    Tsai et al.

FOREIGN PATENT DOCUMENTS

| EP | 2006929 A2 | 12/2008 |
| GB | 2379083 A | 2/2003 |
| GB | 2388709 A | 11/2003 |
| WO | WO-9919900 A2 | 4/1999 |
| WO | WO-2005027216 A2 | 3/2005 |

OTHER PUBLICATIONS

European Patent Office, International Search Report for PCT/FR2011/050466, in English and French Language, dated May 2, 2011 (6 pgs).

*Primary Examiner* — Michelle Mandala
(74) *Attorney, Agent, or Firm* — Harris Beach PLLC

(57) ABSTRACT

The invention relates to a method for manufacturing adjacent first and second areas of a surface, said areas consisting, respectively, of first and second materials that are different from each other. Said method involves: depositing a first liquid volume that encompasses the first area and comprises a solvent in which the first material is dispersed; depositing a second liquid volume that encompasses the second area and comprises a solvent in which the second material is dispersed; and removing the solvents. According to the invention, the solvents of the first and second volumes are immiscible, and the second volume is simultaneously or consecutively deposited with the deposition of the first volume, before the first volume reaches the second area.

17 Claims, 1 Drawing Sheet

METHOD FOR MANUFACTURING TWO ADJACENT AREAS MADE OF DIFFERENT MATERIALS

CROSS-REFERENCE TO RELATED APPLICATIONS

This application is a national stage application under 35 U.S.C. §371 of PCT Application No. PCT/FR2011/050466, filed Mar. 7, 2011, which claims priority to and the benefit of French Application No. 1052647 filed on Apr. 8, 2010, which are incorporated herein by reference in its entirety.

DOMAIN OF THE INVENTION

The present disclosure relates to the manufacturing of adjacent areas of a surface made of different materials. It more specifically applies to the manufacturing of microelectronic components, such as transistors, for example.

BACKGROUND

A usual technique to manufacture a layer of a material on a surface comprises dispersing this material in a solvent, depositing one or several drops of the liquid solution thus obtained on a target area which is desired to be coated with the material, and then removing the solvent, for example, by evaporation.

Such a manufacturing technique however reaches its limits when several adjacent areas are to be manufactured in different material as the distance between such areas decreases.

Thus, for example, the manufacturing of microelectronic components, such as for example transistors, requires depositing drops of liquid on a small area, while avoiding for this same liquid to flow out on adjacent areas, distant by a few micrometers only. Indeed, such adjacent areas have different functions implemented by different materials. An adjacent area thus should not receive a material which is not intended for it, since this would risk making the microelectronic component unusable.

Now, it is very difficult, and even impossible, to accurately control the way in which a drop deposited on a surface will spread. Indeed, the spreading of a drop depends on many factors, such as its composition, the material, and the geometry of the surface receiving it, environmental conditions (temperature, hygrometry . . . ), or the characteristics of its deposition (distance and speed of flight of the drop before its impact on the surface, diameter and controller of the nozzle used to deposit the drop . . . ). Further, this difficulty is all the stronger as the manufacturing implies drops comprising organic materials and/or solvents since, in such depositions, the drops have a strong tendency to spread.

Thus, the forming of an area by deposition of a liquid conventionally requires previously covering the adjacent areas with a masking resin, especially by means of a photolithography, carrying out the deposition and the evaporation of the liquid on the target area, and then of removing the masking resin with an adequate chemical bath. This operation is repeated for each area to be manufactured, thus multiplying manufacturing steps, and thus the total manufacturing cost.

SUMMARY

The present invention aims at providing a manufacturing method which is simple, accurate, and which protects adjacent areas from one another without using additional protection steps.

To achieve this, an object of the present invention is a method for manufacturing a first and a second adjacent areas of a surface, respectively formed of a first and of a second different materials, the method comprising:

depositing a first liquid volume enclosing the first area and comprising a solvent in which the first material is dispersed, depositing a second liquid volume enclosing the second area and comprising a solvent in which the second material is dispersed, and removing the solvents.

According to the present invention:

the solvents of the first and of the second volumes are immiscible;

the second volume is deposited simultaneously or consecutively to the deposition of the first volume, before the first volume reaches the second area.

In other words, the spreading of a liquid volume is naturally blocked by the presence of another liquid with which it is not miscible. For the manufacturing of adjacent areas, it is thus not necessary to provide additional masking steps, the deposition itself providing the masking necessary for each area to only receive the material which is intended for it. This not only avoids many manufacturing steps, but it further makes the manufacturing of adjacent areas closer in time, which further accelerates the manufacturing.

"Solvent" is here used to designate a liquid enabling to dissolve a material, or to disperse particles or nano-objects.

According to embodiments of the present invention:

the first and the second volumes are deposited simultaneously;

one of the solvents is a polar solvent, and the other solvent is non-polar solvent;

the non-polar solvent is a fluorinated solvent;

the polar solvent is alcohol, and especially isopropanol;

the polar solvent is water, and the non-polar solvent is hexane or tetraline;

the polar solvent is an alcohol, and especially methanol, and the non-polar solvent is tetraline or hexane;

the first and second materials are intended to form SAMs;

the first and second areas comprise electrodes on which the SAMs are formed, and especially electrodes of MOS transistors of a CMOS circuit;

the first material is 2,3,4,5,6-pentafluorobenzenethiol, and the second material is 4-methoxythiophenol;

the first and second materials are semiconductor materials;

the first material is 6,13-bis(triisopropylsilylethynyl)pentacene (TIPS-pentacene) or a molecule of fluorinated anthradithiophene type, advantageously fluorinated 5,11-bis(triethylsilylethynyl)anthradithiophene, and the second material is a molecule of acene diimide type;

the first and second areas respectively form the electrodes of a P transistor and the electrodes of an N transistor;

the first and second areas form the electrodes of a diode or of a LEFET transistor;

the first and second materials are insulating materials;

the first and second areas form the gate oxides of juxtaposed transistors; and the liquid volumes are deposited by ink jet.

BRIEF DESCRIPTION OF THE DRAWINGS

The foregoing and other features and advantages of the present invention will be discussed in detail in the following non-limiting description of a method according to the present invention for manufacturing of a CMOS base structure in

DETAILED DESCRIPTION

FIGS. 1 to 6 illustrate, in cross-section views, steps of the manufacturing of a CMOS base structure according to the present invention. This structure comprises a P transistor and an N transistor.

First, conventionally, metal source and drain electrodes 10 of the P transistor and metal source and drain 12 of the N transistor are formed on a plastic substrate 14, for example, polyethylene naphthalate (PEN). For example, electrodes 10 are separated from electrodes 12 by a distance approximately ranging between 100 and 200 micrometers.

Figure 1:
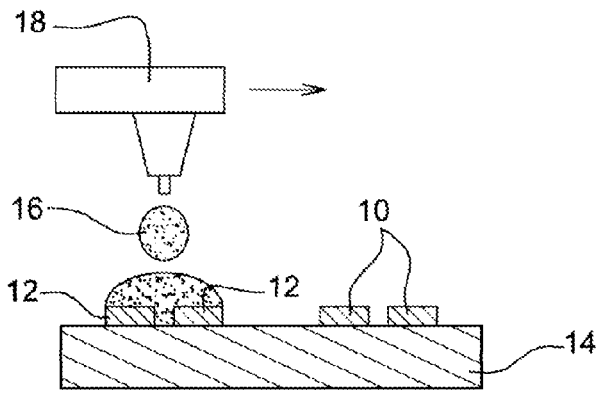
Figure 2:
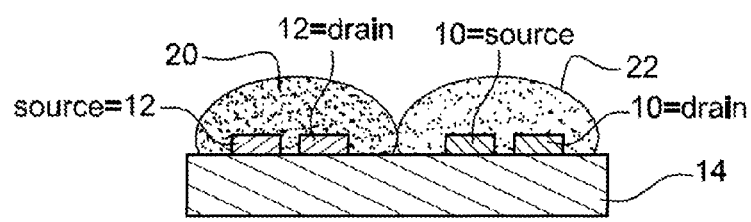

One or several drops 16 of a first liquid, comprising a dispersion of a first P-type injection SAM semiconductor material, for example, 2,3,4,5,6-pentafluorobenzenethiol, in a first solvent, are then deposited on electrodes 12 by means of an inkjet printing device nozzle 18 (FIG. 1). A volume 20 of liquid solution comprising the first material and enclosing electrodes 12 thus forms (FIG. 2).

Nozzle 18 is then shifted to be placed above electrodes 10 before volume 20 has time to spread in the vicinity of electrodes 10, and one or several drops of a second liquid, comprising a dispersion of a second N-type injection SAM semiconductor material, for example, 4-methoxythiophenol, in a second solvent, are then deposited on electrodes 10. A volume 22 of liquid solution comprising the second material and enclosing electrodes 10 thus forms (FIG. 2).

As known per se, a SAM ("Self-Assembled Monolayer") is a layer obtained by grafting. As known, the manufacturing of a SAM requires a large volume of organic solvent to perform the self-assembly on electrodes 10, 12, thus implying volumes 20 and 22 of significant dimension, and thus capable of spreading far beyond the immediate neighborhood of the electrodes for which they are intended. Generally, solutions having a concentration ranging between $10^{-5}$% and 10% of the material to be deposited are used.

SAMs enable to adapt the work function of an electrode to the semiconductor which coats the electrode. They are of two types:
  P-type SAMs, which increase the work function of P electrodes and which thus improve their electron injection efficiency,
  and N-type SAMs, which increase the work function of N electrodes and which thus improve their hole injection efficiency.

As a variation, two different nozzles are simultaneously used, one for the deposition of volume 20 on electrodes 12, the other for the deposition of volume 22 on electrodes 10.

Advantageously, the solvent of volume 20 and the solvent of volume 22 are selected to be immiscible, or "orthogonal", whereby volumes 20 and 22 mutually block and thus protect their respective deposition area. Thus, for example, volume 20 blocks volume 22 during its spreading and thus prevents volume 22 from reaching electrodes 12 and their neighborhood.

Figure 3:
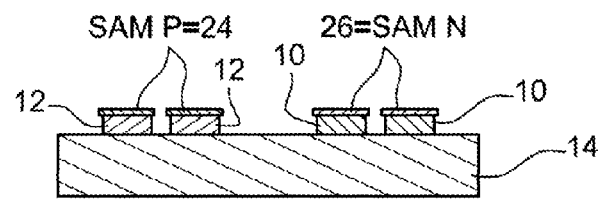

The method then carries on with the removal of the solvents, for example, by evaporation at a temperature selected in appropriate fashion according to the solvents of volumes 20 and 22. Thus, a P-type SAM 24 is formed on electrodes 12 and an N-type SAM 26 is formed on electrodes 10 (FIG. 3).

The method may then conventionally carry on with:
  the forming of a volume 28 of P-type semiconductor material enclosing electrodes 12, especially 6,13-bis(triisopropylsilylethynyl)pentacene, known as "TIPS-pentacene", or a molecule of fluorinated anthradithiophene type, advantageously fluorinated 5,11-bis(triethylsilylethynyl)anthradithiophene;
  and the forming of a volume 30 of N-type semiconductor material enclosing electrodes 10, and especially a molecule of acene diimide type.

Figure 4:
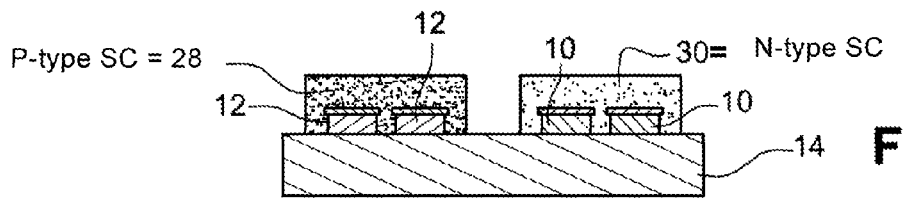
Figure 5:
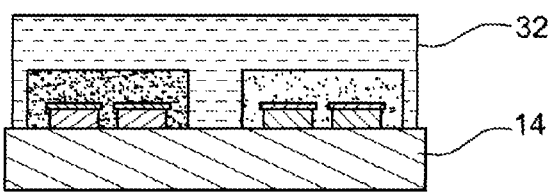
Figure 6:
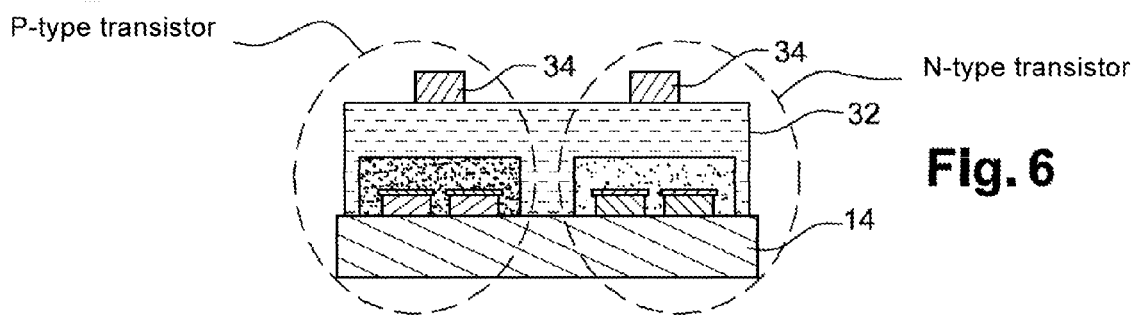

A lithography is for example used (FIG. 4). It should be noted that the previously described deposition technique may also be used for the forming of volumes 28 and 30. A dielectric layer 32 is then formed on the assembly (FIG. 5) and metal electrodes for the transistor gate are formed on dielectric 32 (FIG. 6).

When there are several different dielectric areas, such areas may also be deposited in a way similar to what has been described hereabove.

According to the present invention, the first solvent is non-polar and the second solvent is polar. More specifically, the non-polar solvent is a fluorinated solvent and the polar solvent is alcohol, and especially isopropanol.

As a variation, the polar solvent is water, and the non-polar solvent is hexane or tetraline.

According to another variation, the polar solvent is an alcohol, and especially methanol, and the non polar solvent is tetraline or hexane.

Of course, the present invention applies to any type of material to be deposited, for example, any type of conductive, semiconductor, or insulating material, as soon as it is desired for said material to be deposited on a well-defined area. The forming of MOS transistors of a CMOS circuit can thus be mentioned, as well as the forming of diode electrodes or of LEFET transistors.

Similarly, it should be understood that the previously-described CMOS structure manufacturing corresponds to a specific application of an advantageous embodiment of the present invention.

More generally, this embodiment of the present invention comprises depositing one or several types of materials on distinct adjacent areas by providing for each of these a mechanism of affinity with the material which is intended for it.

Thus, once the solution volumes have been deposited and block each other due to the orthogonality of the solvents used, the material to be deposited contained in a solution preferentially deposits on the corresponding target area.

Further, still due to the mechanism of affinity between a target area and the material intended for it, the material "bonds" to the target area more strongly than to the surface surrounding said area. A cleaning of the assembly, for example, a rinsing thereof, then results in removing the deposited material around each target area, while keeping the material deposited on the target area.

Advantageously, as for example described in relation with the previous application, the affinity mechanism is that of SAMs for which the materials involved (material to be deposited and material at the surface or forming the target area) are selected to form a to stronger bond, most often of metallic type, between the material at the surface or forming the target area and the material to be deposited thereon.

The combination of immiscible (orthogonal) solutions with the affinity mechanism thus enables to manufacture adjacent areas of a few square micrometers by using inkjet depositions having an accuracy on the order of some ten, or even of some hundred micrometers, and this, simultaneously and without using masks.

The invention claimed is:
1. A method for manufacturing a first and a second adjacent areas of a surface, respectively formed of a first and of a second different materials, the method comprising:

depositing a first liquid volume enclosing the first area and comprising a solvent in which the first material is dispersed, depositing a second liquid volume enclosing the second area and comprising a solvent in which the second material is dispersed, and removing the solvents, wherein the solvents of the first and of the second volumes are immiscible;

and wherein the second volume is deposited simultaneously or consecutively to the deposition of the first volume, before the first volume reaches the second area.

2. The method of claim 1, wherein the first and second liquid volumes are deposited by ink jet.

3. The method of claim 1, wherein the first and the second liquid volumes are deposited simultaneously.

4. The method of claim 1, wherein one of the solvents is a polar solvent and in that the other solvent is a non-polar solvent.

5. The method of claim 4, wherein the non-polar solvent is a fluorinated solvent.

6. The method of claim 5, wherein the polar solvent is alcohol, and especially isopropanol.

7. The method of claim 4, wherein the polar solvent is water, and in that the non-polar solvent is hexane or tetraline.

8. The method of claim 4, wherein the polar solvent is an alcohol, and especially methanol, and in that the non polar solvent is tetraline or hexane.

9. The method of claim 1, wherein the first and second materials are intended to form self-assembled monolayers (SAMs).

10. The method of claim 9, wherein the first and second areas comprise electrodes on which the self-assembled monolayers (SAMs) are formed, and especially electrodes of MOS transistors of a CMOS circuit.

11. The method of claim 10, wherein the first material is 2,3,4,5,6-pentafluorobenzenethiol, and wherein the second material is 4-methoxythiophenol.

12. The method of claim 1, wherein the first and second materials are semiconductor materials.

13. The method of claim 12, wherein the first material is 6,13-bis(triisopropylsilylethynyl)pentacene (TIPS-pentacene) or a molecule of fluorinated anthradithiophene type, advantageously fluorinated 5,11-bis(triethylsilylethynyl)anthradithiophene, and wherein the second material is a molecule of acene diimide type.

14. The method of claim 1, wherein the first and second areas respectively form the electrodes of a P transistor and the electrodes of an N transistor.

15. The method of claim 1, wherein the first and second areas form the electrodes of a diode or of a light-emitting field-effect transistor (LEFET) transistor.

16. The method of claim 1, wherein the first and second materials are insulating materials.

17. The method of claim 16, wherein the first and second areas form the gate oxides of juxtaposed transistors.

* * * * *